US007879531B2

(12) United States Patent
Zhang et al.

(10) Patent No.: US 7,879,531 B2
(45) Date of Patent: Feb. 1, 2011

(54) IMMERSION LITHOGRAPHY FLUIDS

(75) Inventors: Peng Zhang, Quakertown, PA (US);
Bridgette Maria Budhlall, Bethlehem, PA (US); Gene Everad Parris, Coopersburg, PA (US); Leslie Cox Barber, Cave Creek, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 390 days.

(21) Appl. No.: 11/030,132

(22) Filed: Jan. 7, 2005

(65) Prior Publication Data

US 2005/0173682 A1     Aug. 11, 2005

Related U.S. Application Data

(63) Continuation-in-part of application No. 10/764,227, filed on Jan. 23, 2004, now abandoned.

(51) Int. Cl.
*G02B 1/06* (2006.01)
*G02F 1/361* (2006.01)

(52) U.S. Cl. .................. 430/311; 252/588; 252/589; 252/582

(58) Field of Classification Search .................. None
See application file for complete search history.

(56) References Cited

U.S. PATENT DOCUMENTS

| 4,480,910 | A | 11/1984 | Takanashi et al. | |
|---|---|---|---|---|
| 4,617,490 | A * | 10/1986 | Fitzpatrick et al. | 313/478 |
| 6,890,619 | B2 * | 5/2005 | Troll | 428/156 |
| 7,033,523 | B2 | 4/2006 | Tork et al. | |
| 7,125,652 | B2 * | 10/2006 | Lyons et al. | 430/311 |
| 7,317,507 | B2 | 1/2008 | Straaijer | |
| 7,589,242 | B2 | 9/2009 | French et al. | |
| 2002/0163629 | A1 | 11/2002 | Switkes et al. | |
| 2005/0036183 | A1 | 2/2005 | Yeo et al. | |
| 2005/0074686 | A1 | 4/2005 | Bassi et al. | |
| 2005/0094116 | A1 | 5/2005 | Flagello et al. | |
| 2005/0164502 | A1 | 7/2005 | Deng et al. | |
| 2005/0164522 | A1 | 7/2005 | Kunz et al. | |
| 2005/0186513 | A1 | 8/2005 | Letz et al. | |
| 2005/0186514 | A1 | 8/2005 | French et al. | |
| 2007/0164261 | A1 | 7/2007 | Miyamatsu et al. | |

FOREIGN PATENT DOCUMENTS

| EP | 0063684 A1 | 11/1982 |
|---|---|---|
| EP | 1 521 118 A2 | 4/2005 |
| JP | 4-305915 A | 10/1992 |
| JP | 04-305915 A | 10/1992 |
| JP | 06-167653 A | 6/1994 |
| JP | 6-167653 A | 6/1994 |
| JP | 10-303114 A | 11/1998 |
| JP | 10-340846 A | 12/1998 |
| JP | 10340846 | 12/1998 |
| JP | 2002-53839 A | 2/2002 |
| JP | 2002-053839 A | 2/2002 |
| JP | 2002-144752 A | 5/2002 |
| JP | 2003-185951 A | 7/2003 |
| JP | 2005-072230 A | 3/2005 |
| JP | 2005-093997 A | 4/2005 |
| JP | 2008-502154 A | 1/2008 |
| KR | 10-2004-0058966 A | 7/2004 |
| RU | 2051940 C1 | 1/1996 |
| SU | 948994 A1 | 8/1982 |
| SU | 1204623 A1 | 1/1986 |
| WO | 99/01797 | 1/1999 |
| WO | 99/49504 A1 | 9/1999 |
| WO | 99-49504 A1 | 9/1999 |
| WO | 03/077034 A2 | 9/2003 |
| WO | 03/077037 A1 | 9/2003 |
| WO | WO 03/077034 A2 | 9/2003 |
| WO | WO 2004/079800 A1 | 9/2004 |
| WO | WO 2005/001432 A2 | 1/2005 |
| WO | 2005/050324 A2 | 6/2005 |
| WO | 2005/074606 A2 | 8/2005 |
| WO | WO 2005/078525 A2 | 8/2005 |
| WO | WO 2005/087693 A2 | 9/2005 |
| WO | 2005-114711 A1 | 12/2005 |
| WO | 2006/045748 A2 | 5/2006 |

OTHER PUBLICATIONS

Grant & Hackh'S Chemical Dictionary, 1987, McGraw-Hill, 5th Edition, p. 290.*
"Liquid Immersion Deep-ultraviolet Interferometric Lithography", J. Vac, Sci. Technol. B 17 (6), Nov./Dec. 1999, J. A. Hoffnagle et al., pp. 3306-3309.*
A.K. Raub, et al., "Deep UV Immersion Interferometric Lithography," *Proceedings of SPIE*, vol. 5040, pp. 667-678 (2003).
M. Switkes, et al., "Immersion Lithography: Beyond the 65nm Node With Optics," *Microlithography World*, 12(2), 4-6, 18, 20 (2003).
M. Switkes, et al., "Immersion Liquids for Lithography in the Deep Ultraviolet," *Proceedings of SPIE*, vol. 5040, pp. 690-699 (2003).
S. Owa, et al., "Immersion Lithography: Its Potential Performance and Issues," *Proceedings of SPIE*, vol. 5040, pp. 724-730 (2003).
W. Conley, et al., "New Fluids for 193nm Immersion Lithography," Immersion Workshop held in conjunction with the Litho Forum of Jan. 28, 2004 by International SEMATECH.
S. Robertson, et al., "Effects of Immersion Lithography on Diffusivity During PEB," Immersion Workshop held in conjunction with the Litho Forum of Jan. 28, 2004 by International SEMATECH.

(Continued)

*Primary Examiner*—Daborah Chacko Davis
(74) *Attorney, Agent, or Firm*—Rosaleen P. Morris-Oskanian

(57) ABSTRACT

Suitable additives that may be added into immersion fluids, immersion fluids comprising at least one carrier medium selected from an aqueous fluid, a non-aqueous fluid, and mixtures thereof, and immersions fluids comprising at least one carrier medium and at least one additive useful for performing immersion lithography at an operating wavelength ranging from 140 nm to 365 nm are disclosed herein.

13 Claims, 3 Drawing Sheets

OTHER PUBLICATIONS

B. Smith, et al., "Water-Based 193nm Immersion Lithography," Immersion Workshop held in conjunction with the Litho Forum of Jan. 28, 2004 by International SEMATECH.

M. Rothschild, et al, Liquid Immersion Lithography: Why, How, and When?, J. Vac. Sci. Technol. B 22(6), Nov./Dec. 2004, pp. 2877-2881.

S.R.J. Brueck, There Are No Fundamental Limits to Optical Lithography, The Univ. of New Mexico, Year 3 Review Presentation, Apr. 2001-May 2002.

EETIMES.COM, Efforts to achieve 157-nm immersion still afloat, eeDesign News: Silicon Engineering, Feb. 2004.

Roderick R. Kunz et al, Transparent fluids for 157-nm immersion lithography, J. Microlith., Microsyste., vol. 3 No. 1, Jan. 2004, pp. 73-83.

M. Rothschild et al, Nanopatterning with UV Optical Lithography, MRS Bulletin, vol. 30, Dec. 2005, pp. 942-946.

* cited by examiner

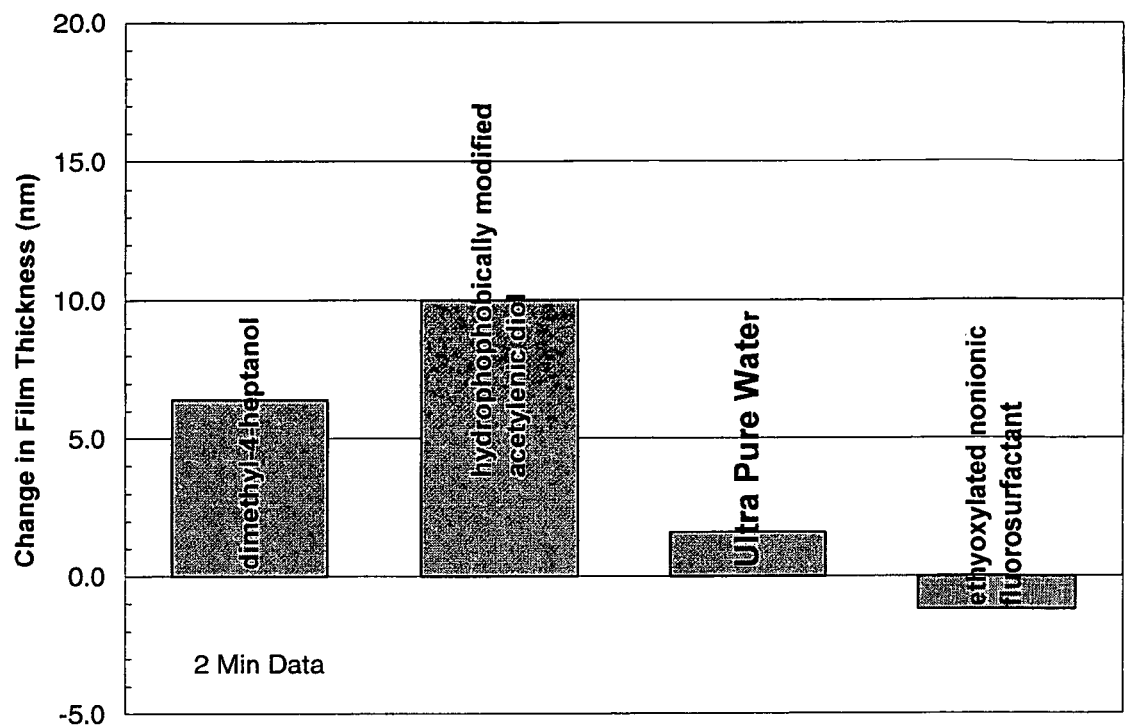
Figure 3
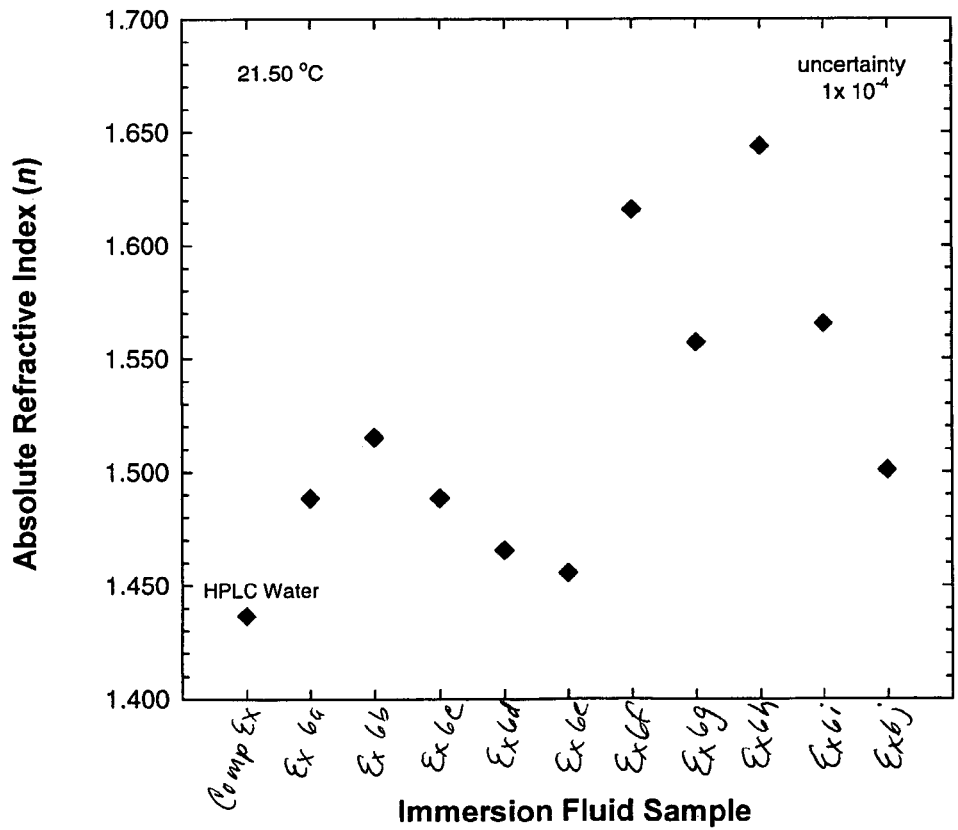
Figure 4. Absolute Refractive index of Immersion Fluids @ 193nm

IMMERSION LITHOGRAPHY FLUIDS

CROSS-REFERENCE TO RELATED APPLICATIONS

This application is a continuation-in-part of U.S. patent application Ser. No. 10/764,227, filed 23 Jan. 2004, now abandoned the disclosure of which is incorporated herein by reference in its entirety.

BACKGROUND

Immersion lithography may offer better resolution enhancement and higher numerical apertures at a given exposure wavelength over conventional projection lithography. For example, immersion lithography could extend lithography at the 193 nm wavelength down to the 45 nm node and below thereby providing an alternative to 157 nm exposure wavelengths, extreme ultraviolet (EUV), and other potential technologies.

The minimum feature width (W) that may be printed with an optical lithography system is determined by the Rayleigh equation: $W=(k_1\lambda)/(NA)$ where $k_1$ is the resolution factor, $\lambda$ is the wavelength of the exposing radiation and NA is the numerical aperture. Numerical aperture (NA) is determined using the equation: $NA=n \sin \alpha$ where n is the index of refraction of the medium surrounding the lens and $\alpha$ is the acceptance angle of the lens. The physical limit to NA for exposure systems using air as a medium between the lens and the wafer is 1. Air is the worst medium because its index of refraction may cause a relatively high amount of bending when light leaves the glass. Since the index of refraction for water and glass is approximately 1.44 and 1.52 respectively, far less bending occurs thereby providing a sharper and deeper focus.

In immersion lithography, the space between the lens and the substrate is filled with a liquid, referred to herein as an immersion fluid, that has a refractive index greater than 1. The immersion fluid should preferably exhibit a low optical absorption at the operating wavelength such as, for example 193 nm and 157 nm, be compatible with the photoresist and the lens material, be uniform and be non-contaminating. A preferred immersion fluid for 193 nm immersion lithography is ultra pure water. Ultra pure water has an index of refraction of approximately 1.44, exhibits absorption of less than 5% at working distances of up to 6 mm, is compatible with photoresist and lens, and is non-contaminating in its ultra pure form. Applying the Rayleigh equation using n=1.44 and assuming $\sin \alpha$ can reach 0.93, the feature width for 193 nm could reach a theoretical minimum resolution of 36 nm. Still other immersion fluids that have been considered for 15 nm immersion lithography are KRYTOX™ and perfluoropolyether (PFPE).

To date, immersion lithography has not been widely implemented in commercial semiconductor processing partly because improvements in resolution by conventional methods have been possible, but also partly because of practical limitations in implementing immersion lithography. The wafer stage of a typical 193 nm exposure tool steps from location to location across the wafer scanning the reticle image for each field. In order to achieve high throughput, the stage should accelerate rapidly, move accurately to the next field location, settle, scan the image, and then step to the next location within a short time interval. The immersion fluid is typically introduced between the lens and the resist surface of the substrate using a jet stream of the immersion fluid. The space between the lens and the resist surface, referred to herein as the working distance, is less than 6 mm or typically 1 mm. Due to a variety of factors such as short process cycle time, minimal working distance, and dynamics of the immersion stream, maintaining a consistent bubble free liquid between the lens and the resist-coated wafer is very difficult. Further, there is a lack of immersion fluids that have appropriate optical transmission characteristics and chemical compatibility with lithographic systems.

The desire to develop immersion systems is growing more acute because the ability to achieve resolution improvements via conventional means, such as wavelength reduction, appears to be increasingly difficult, particularly at wavelengths below 365 nm. In addition, with numerical apertures or NAs produced by lithographic methods using air as the immersion medium approaching the theoretical limit, progress using conventional methods is bounded. Accordingly, there is a need for an immersion fluid that is compatible with immersion lithographic systems, particularly those systems having an operative wavelength below 365 nm.

BRIEF SUMMARY

Immersion fluids comprising at least one carrier medium and immersion fluids comprising at least one carrier medium and at least one additive are disclosed herein. In one aspect of the present invention, there is provided an immersion fluid comprising: about 1 ppm to a maximum solubility limit of at least one additive selected from an alkyl alcohol; an alkyl ethoxylate, an alkyl propoxylate, and derivative thereofs; an alkyl acid ester; an alkyl amine comprising an amine group; an alkyl amine ethoxylate; an acetylenic alcohol, an acetylenic diol, and ethylene oxide/propylene oxide derivatives thereof; an alkyl polyglycoside; a block oligomer; a polymer of ethylene and propylene oxide; a glycidyl ether; a glucamine derivative of a glycidyl ether; an urea; a siloxane-containing compound; a fluorinated or partially fluorinated acetylenic alcohol, diol and derivatives thereof; a fluorosurfactant; an ionic liquid; a salt; and an electrolyte, provided that if the at least one additive is a fluorosurfactant then the immersion fluid comprises about 1% by weight or greater of an aqueous fluid.

In another aspect of the invention, there is provided immersion fluid having a transmission of 50% or greater at an operating wavelength ranging from 140 nm to 365 nm comprising: at least one carrier medium selected from the group consisting of an aqueous fluid, a non-aqueous fluid, and mixtures thereof wherein the at least one carrier medium has a refractive index greater than or equal to water at the operating wavelength; and from about 1 ppm to the maximum solubility limit of at least one additive selected from an alkyl alcohol; an alkyl ethoxylate, an alkyl propoxylate, and derivative thereofs; an alkyl acid ester; an alkyl amine comprising an amine group; an alkyl amine ethoxylate; an acetylenic alcohol, an acetylenic diol, and ethylene oxide/propylene oxide derivatives thereof; an alkyl polyglycoside; a block oligomer; a polymer of ethylene and propylene oxide; a glycidyl ether; a glucamine derivative of a glycidyl ether; an urea; a siloxane-containing compound; a fluorinated or partially fluorinated acetylenic alcohol, diol and derivatives thereof; a fluorosurfactant; an ionic liquid; a salt; and an electrolyte, provided that if the at least one additive is a fluorosurfactant then the immersion fluid comprises about 1% by weight or greater of an aqueous fluid.

In a further aspect of the present invention, there is provided an immersion fluid having a transmission of 50% or greater at an operating wavelength ranging from 140 nm to 365 nm comprising: at least one carrier medium selected from an aqueous fluid, a non-aqueous fluid, and a mixture of the non-aqueous fluid and the aqueous fluid wherein the at least one carrier medium has a refractive index greater than or equal to water at the operating wavelength and wherein if the at least one carrier medium is the mixture then the non-aqueous fluid is water miscible.

BRIEF DESCRIPTION OF SEVERAL VIEWS OF THE DRAWINGS

FIG. 3 provides comparison of the change in film thickness (nm) for various embodiments of the immersion fluid of the present invention compared to ultra pure water.

FIG. 4 compares the absolute refractive index of various immersion fluids disclosed herein measured at a wavelength of 193 nm.

DETAILED DESCRIPTION

Figure 1:
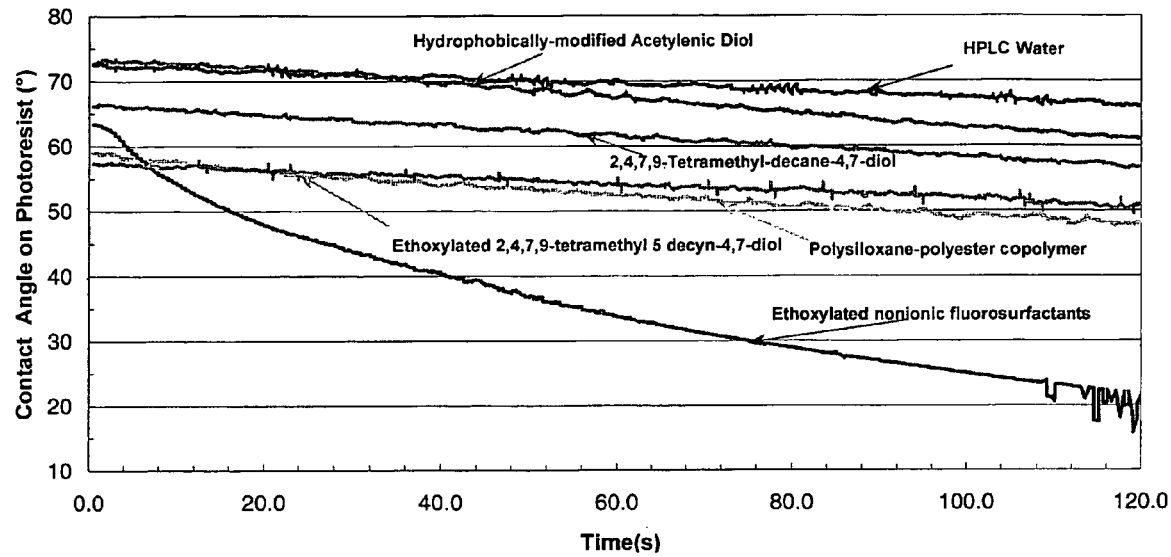
FIG. 1 provides the dynamic contact angle measurements for various embodiments of the immersion fluid of the present invention on unexposed 193 nm photoresists.

Immersion fluids, comprising at least one carrier medium or comprising at least one carrier medium and at least one additive, useful for performing immersion lithography at operating wavelengths ranging from 140 to 365 nm, particularly 157 nm and/or 193 nm wavelengths are disclosed herein. The term "carrier medium" as used herein relates to an aqueous fluid, a non-aqueous fluid, or a mixture thereof that may be used by itself or have at least one additive added thereto to provide an immersion fluid. The term "fluid" as used herein describes a gas, liquid, a nanoparticle suspension, a supersaturated liquid, vapors, and combinations thereof. In embodiments wherein the aqueous fluid, non-aqueous fluid, and/or immersion fluid comprises a nanoparticle suspension, the average particle size of the nanoparticles contained therein is about 20% or less of the operating wavelength.

It is believed that the presence of the at least one additive within the at least one carrier medium such as, for example, a salt, a surfactant, an electrolyte or mixtures thereof within an immersion fluid, or the immersion fluid comprising at least one carrier medium without the addition of at least one additive, may provide at least one of the following benefits: improve the wetting of the immersion fluid onto the resist-coated substrate; reduce defect formation by substantially minimizing the formation of micro-bubbles and nano-bubbles; protect the resist surface by forming aggregations of one or more monolayers at the resist-immersion fluid interface or resist-protective-layer and immersion fluid interface thereby preventing leaching of any chemicals from the resist; minimize the feature size and maximize the resolution when added into an immersion fluid with a refractive index equal to or greater than water at the operating wavelength, such as for example a refractive index equal to or greater than 1.44 at an operating wavelength of 193 nm, thereby allowing smaller feature sizes to be achieved; increase the refractive index of the immersion fluid if the carrier medium such as water has a low absorbance at wavelengths ranging from 140 to 365 nm provided that there is no interaction between the photoresist and the optics; and minimize the change in feature size upon exposure to light or heat by adding at least one additive to the carrier medium having the opposite refractive index/temperature characteristics (dn/dT) that may minimize or eliminate the change in refractive index upon exposure to laser light or heat. Further, the addition of at least one additive to a carrier medium, or the carrier medium itself, may provide an immersion fluid that does not significantly increase the absorbance of the immersion fluid at one or more operating wavelengths or maintains the absorbance below 5%, or below 1%, or below 0.5%. The immersion fluid containing at least one carrier medium and at least one additive, or the immersion fluid containing at least one carrier medium, may exhibit 50% or greater, 80% or greater, or 90% or greater total transmission.

As mentioned previously, the immersion fluid may comprise at least one carrier medium that is an aqueous fluid, a non-aqueous fluid, or a mixture thereof that may have at least one additive added thereto, or alternatively, the immersion fluid may be the carrier medium itself.

In certain embodiments, the carrier medium may comprise an aqueous fluid. In these embodiments, the refractive index may be equal to or greater than the refractive index of water at the operating wavelength such as, for example, a refractive index of 1.44 at an operating wavelength of 193 nm. Further, the aqueous fluid transmits light at the operating wavelengths of the lithography system such as a wavelength ranging from 140 to 365 nm. The term "aqueous" as used herein, describes a fluid dispersing medium, which comprises at least 80 weight percent, preferably 90 weight percent, and more preferably at least 95 weight percent water. Examples of suitable aqueous fluids include deionized water, ultra pure water, distilled water, doubly distilled water, and high performance liquid chemical (HPLC) grade water or deionized water having a low metal content.

In certain embodiments, the carrier medium may comprise a non-aqueous fluid. In these embodiments, the non-aqueous fluid is used in addition to, or in place of, an aqueous fluid. In these embodiments, the non-aqueous fluid selected preferably does not react with other components in the immersion fluid, the photoresist coating on the substrate, the system optics, or the substrate itself. In embodiments wherein the immersion fluid has at least one additive contained therein, the non-aqueous fluid preferably does not react with the at least one additive contained therein. Suitable fluids include, but are not limited to, hydrocarbons and derivatives thereof, including but not limited to, cyclic alkanes and acyclic alkanes (e.g. dodecane, hexane, pentane, hexadecane, cyclohexane, bicyclohexyl, tricyclohexane, decahydronapthalene, and cyclopentane; fluorinated (partially or fully) hydrocarbons and derivatives thereof (e.g., perfluorocyclohexane and perfluorodecalin); $SF_5$-functionalized hydrocarbons; halocarbons (e.g. Freon 113); ethers (e.g. ethylether ($Et_2O$), tetrahydrofuran ("THF"), ethylene glycol and derivatives thereof, monomethyl ether, or 2-methoxyethyl ether (diglyme)), and esters and derivatives thereof (e.g. sodium octanoate and sodium perfluorooctanoate). Still further exemplary fluids include lactates, pyruvates, and diols. These fluids include ketones such as, but are not limited to, acetone, ethyl acetate, cyclohexanone, acetone, N-methylpyrrolidone (NMP), and methyl ethyl ketone. Other exemplary non-aqueous fluids include amides such as, but not limited to, dimethylformamide, dimethylacetamide, acetic acid anyhydride, propionic acid anhydride, and the like. Exemplary non-aqueous fluids can include, but are not limited to, sulfur-containing compounds such as mercaptans (e.g., lauryl mercaptan), sulfones (e.g., dimethyl sulfone, diphenyl sulfone, sulfoxides (e.g., dimethyl sulfoxide). Still further non-aqueous fluids include alcohols such as, for example, propylene glycol propyl ether (PGPE), methanol, tetrahydrofurfuryl alcohol, 1-methylcyclohexanol, cyclohexanol, 2-methylcyclohexanol, adamantemethanol, cyclopentanol, dimethyl-3-heptanol, dimethyl-4-heptanol, dodecanol, oleyl alcohol, pentanol, 1,5-pentanediol, 1,6-hexanediol, 1,4-butanediol, 1,2-propylene glycol, 1,3-propylene glycol, 1-dodecanol, cyclooctane, ethanol, 3-heptanol, 2-methyl-1-pentanol, 5-methyl-2-hexanol, cis-2-methylcyclohexanol, 3-hexanol, 2-heptanol, 2-hexanol, 2,3-dimethyl-3-pentanol, propylene glycol methyl ether acetate (PGMEA), ethylene glycol and derivatives thereof, polyethylene glycol and derivatives thereof, isopropyl alcohol (IPA), n-butyl ether, propylene glycol n-butyl ether (PGBE), 1-butoxy-2-propanol, 2-methyl-3-pentanol, 2-methoxyethyl acetate, 2-butoxyethanol, 2-ethoxyethyl acetoacetate, 1-pentanol, propylene glycol methyl ether, 3,6-dimethyl-3,6-octanol, maltose, sorbitol, mannitol, super, fully, and partially hydrolyzed poly(vinyl) alcohol, 1,3-butanediol, glycerol and derivatives thereof such as thioglycerol. Further non-aqueous fluids may comprise an acid such as, for example, sulfuric acid, lactic acid, octanoate acid, polyphosphoric acid, phosphoric acid, hexafluorophosphoric acid, tartaric acid, methane sulfonic acid, trifluoromethane sulfonic acid, dichloroacetic acid, propionic acid, and citric acid. Yet another non-aqueous fluid can be a silicone such as silicone oil. Still further non-aqueous fluids include 1,4-dioxane, 1,3-dioxolane, ethylene carbonate, propylene carbonate, ethylene carbonate, propylene carbonate, and m-cresol. The non-aqueous fluids enumerated above may be used alone, in combination with one or more other non-aqueous fluids, or in combination with an aqueous fluid.

In certain embodiments, the carrier medium may comprise a mixture of at least one aqueous fluid and at least one non-aqueous fluid. In these embodiments, the immersion fluid may contain at least one non-aqueous fluid that is miscible in the aqueous fluid or is water-miscible. The amount of non-aqueous fluid within the immersion fluid may range from about 1 to about 99%, or from about 1 to about 50% by weight with the balance of the carrier medium within the immersion fluid comprising an aqueous fluid. Examples of water-miscible non-aqueous fluids include, but are not limited to, methanol, ethanol, isopropyl alcohol, glycerol, ethylene glycol and derivatives thereof, polyethylene glycol and derivatives thereof and THF.

In certain embodiments, certain non-aqueous fluids, having a refractive index greater than or equal to that of water and a specific absorbance of less than 1 $cm^{-1}$ or less than 0.5 $cm^{-1}$ at one or more operating wavelengths ranging from 140 to 365 nm may be added to the immersion fluid in the amount ranging from 0.1 to 100%, or from 1 to 50% to increase the refractive index of the immersion fluid. At an operating wavelength of 193 nm, the non-aqueous fluid may have a refractive index equal to or greater than that of water or greater than 1.44. Exemplary non-aqueous fluids that may be used at this operating wavelength include, but are not limited to, citric acid (n=1.496), bicyclohexyl (n=1.477), glycerol (n=1.4730), or cis-2-methylcyclohexanol (n=1.4633).

In certain embodiments, the immersion fluid comprises from 10 parts per million (ppm) to the maximum solubility limit, or from 1 ppm to 50% by weight, or from 10 ppm to 10,000 ppm of at least one additive. The term "maximum solubility limit" as used herein relates to the maximum amount of the at least one additive that can be added to the carrier medium to provide a homogenous solution without phase separation and/or precipitation of the at least one additive. Examples of at least one additive that may be used alone, or in combination with one or more other at least one additives, within an immersion fluid include: an alkyl alcohol such as, for example, a polymeric alcohol having one or more hydroxyl groups; an alkyl ethoxylate, an alkyl propoxylate, and (PO) derivatives thereof which may further include mono- and multi-hydrophilic units (such as diols); an alkyl acid ester such as, for example, an alkyl carboxylate or an alkyl acid ester with mono- and multi-carboxyl units; an alkyl amine such as one having one or more amine groups including primary, secondary and tertiary amines; an alkyl amine ethoxylate; an acetylenic alcohol, an acetylenic diol, and ethylene oxide/propylene oxide derivatives thereof; an alkyl polyglycoside; a block oligomer; a polymer of ethylene and propylene oxide; a glycidyl ether or a glucamine derivative of the glycidyl ether with an at least one selected from an alkyl amine, an alkyl diamine, an alkyl alcohol, an acetylenic alcohol, and combinations thereof; a urea such as an alkyl urea or a dialkyl urea; a siloxane-containing compound such as, for example, a polysiloxane, a poly(dimethyl)siloxane, a polysiloxane polyester copolymer, or derivatives thereof; a fluorinated or partially fluorinated acetylenic alcohol, diol or derivatives thereof; a fluorosurfactant; a salt; and an electrolyte. The additives enumerated above may be used alone or in combination with one or more other additives.

In certain embodiments, at least one additive is a surfactant. Typical surfactants exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. In embodiments wherein the at least one additive is a surfactant, the surfactant may be ionic (i.e., anionic, cationic, amphoteric) or nonionic.

In certain embodiments of the present invention, the immersion fluid may contain at least one additive that is an acetylenic alcohol, an acetylenic diol, or an ethylene oxide/propylene oxide derivative thereof. Exemplary acetylenic alcohol, acetylenic diol or ethylene oxide/propylene oxide derivatives that can be used as the at least one additive within an immersion fluid may be represented by the following formulas I through III:

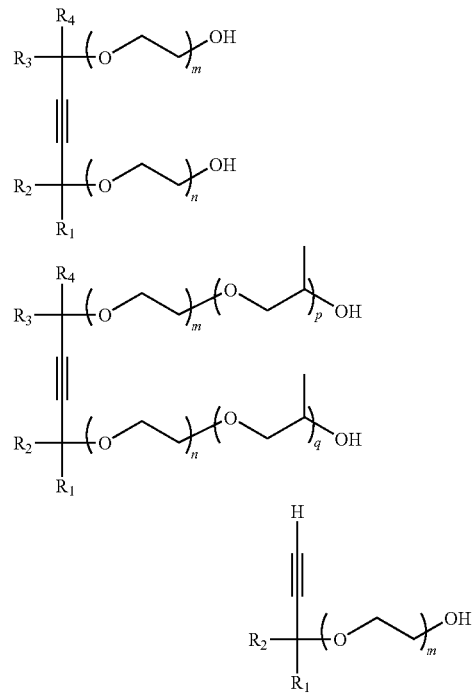

wherein $R_1$ and $R_4$ are each independently a straight or a branched alkyl chain having from 3 to 10 carbon atoms; $R_2$ and $R_3$ are each independently a hydrogen atom or an alkyl chain having from 1 to 5 carbon atoms; and m, n, p, and q are each independently a number that ranges from 0 to 20. The at least one additive having the formula I, II or III are commercially available from Air Products and Chemicals, Inc. of Allentown, Pa., the assignee of the present invention, under the trade names SURFYNOL® and DYNOL®. In certain embodiments, the acetylenic diol portion of the molecule of formulas I or II is 2,4,5,9-tetramethyl-5-decyne-4,7-diol or 2,5,8,11-tetramethyl-6-dodecyne-5,8-diol. The at least one additives having the formulas I through III may be prepared in a number of ways including the methods described, for example, in U.S. Pat. No. 6,313,182 and EP 1115035A1, which are assigned to the assignee of the present invention and incorporated herein by reference in their entirety.

In formulas I and II, the alkylene oxide moieties represented by $(OC_2H_4)$ are the (n+m) polymerized ethylene oxide (EO) molar units and the moieties represented by $(OC_3H_6)$ are the (p+q) polymerized propylene oxide (PO) molar units. The value of (n+m) may range from 0 to 30, preferably from 1.3 to 15, and more preferably from 1.3 to 10. The value of (p+q) may range from 0 to 30, preferably from 1 to 10, and more preferably from 1 to 2.

In other embodiments, the immersion fluid may contain from 1 ppm to the maximum solubility limit or from 1 ppm to 50% by weight or from 10 ppm to 10,000 ppm of at least one additive that is represented by the following formulas (IV) through (Xl):

$$R\text{—}OH; \quad \text{(IVa)}$$

$$R(OCH_2CH_2)_mOH; \quad \text{(IVb)}$$

$$R\text{—}(OCH_2CH_2)mO\text{—}(CH_2CHO)n\text{—}H; \quad \text{(IVc)}$$
(with $CH_3$ on the CHO carbon)

(IVd): structure with central carbon bearing $R_1, R_2, R_3, R_4$, $(CH_2)_j$, and chains $(OCH_2CH_2)_mOH$ and $(OCH_2CH_2)_nOH$ (IVe): structure with central carbon bearing $R_1, R_5, W$ and $(OCH_2CH_2)_tOH$ (Va): diester structure with X, Y substituents and $OR_1$, $OR_4$ ester groups $$RCOO^-M^+ \quad \text{(Vb)}$$

$$R_1COOR_4 \quad \text{(Vc)}$$

$$R_1\text{—}NH\text{—}(CH_2)_r\text{—}N(H)\text{—}(CH_2)_s\text{—}HN\text{—}R_4 \quad \text{(VIa)}$$

$$R_1\text{—}NH\text{—}(CH_2)_r\text{—}NH\text{—}R_4 \quad \text{(VIb)}$$

$$RNH_2 \quad \text{(VIc)}$$

(VId): $R\text{—}N[(CH_2CH_2O)_mH][(CH_2CH_2O)_nH]$ (VIe): $R\text{—}N[(CH_2CH_2O)_mH][(CH_2CH_2O)_nH]\text{—}CH_2CH_2N[(CH_2CH_2O)_iH]$ branched (VII): sugar/glycoside structure with $CH_2OH$, OH groups, O—$CH_2$ linkage, O—R, repeated m times $$HO\text{—}(CH_2CH_2O)m\text{—}(CH_2CHO)i\text{—}(CH_2CH_2O)nH \quad \text{(VIIIa)}$$
(with $CH_3$)

$$HO\text{—}(CHCH_2O)m\text{—}(CH_2CH_2O)i\text{—}(CH_2CHO)nH \quad \text{(VIIIb)}$$
(with $CH_3$ groups)

$$HO\text{—}(CHCH_2O)m\text{—}(CH_2CH_2O)nH \quad \text{(VIIIc)}$$
(with $CH_3$)

(IXa): acetylenic diol structure with $R_1, R_2, R_3, R_4$ and two branches $\text{—}O\text{—}CH_2CH_2\text{—}O\text{—}CH_2CH(OH)CH_2\text{—}O\text{—}R_6$ (IXb): $R_{10}R_{10}N\text{—}(CH_2)_r\text{—}[N(R_{10})]_x\text{—}(CH_2)_s\text{—}N(R_{10})\text{—}CH_2CH(OH)CH_2\text{—}O\text{—}R_{11}$ (X): $R_7\text{—}N^+(R_6)(R_8)\text{—}R_9 \; Z^-$ (XIa): $(F_3C)_2C(OH)\text{—}C\equiv C\text{—}H$ (XIb): $(F_3C)_2C(OH)\text{—}C\equiv C\text{—}C(OH)(CF_3)_2$ -continued

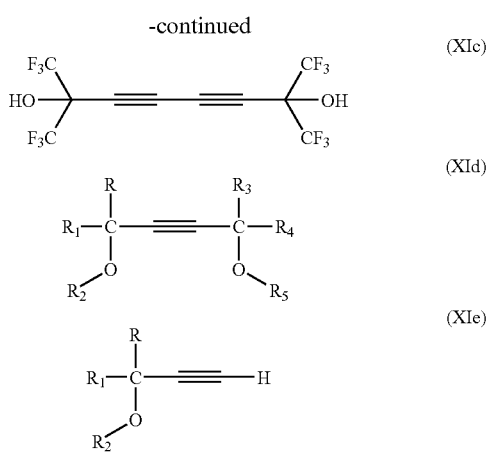

In each of the above formulas, R, $R_1$ and $R_4$ are each independently a straight, branched, or cyclic alkyl, fluoroalkyl, or perfluoroalkyl group having from 2 to 25, or from 3 to 10 carbon atoms; $R_2$ and $R_3$ are each independently a hydrogen atom, a straight, a branched or a cyclic alkyl group, fluoroalkyl group, or perfluoroalkyl group having from 1 to 10 or from 1 to 5 carbon atoms; $R_5$ is a straight, a branched, or a cyclic alkyl, fluoroalkyl, or perfluoroalkyl group having from 1 to 10 carbon atoms; $R_6$ is a straight, a branched, or a cyclic alkyl, fluoroalkyl, or perfluoroalkyl group having from 4 to 16 carbon atoms; $R_7$, $R_8$ and $R_9$ are each independently a straight, a branched, or a cyclic alkyl, fluoroalkyl or perfluoroalkyl group having from 1 to 6 carbon atoms; $R_{10}$ is independently H or a group represented by the formula

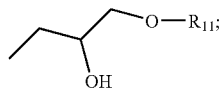

$R_{11}$ is a straight, a branched, or a cyclic alkyl group having from 4 to 22 carbon atoms; W is a hydrogen atom or an alkynyl group; X and Y are either a hydrogen atom or a hydroxyl group; Z is either a halide atom, a hydroxyl group, an acetate group, or a carboxylate group; m, n, p, q are each independently a number ranging from 0 to 20; r and s are each independently 2 or 3; t is a number ranging from 0 to 2; i is a number ranging from 0 to 20; x is a number ranging from 1 to 6, and M is a monovalent metal ion or an ammonium ion.

The at least one additive may be an alkyl alcohol such as, for example, a polymeric alcohol having one or more hydroxyl groups. Exemplary alkyl alcohols or polymeric alcohols include sugar alcohols such as sorbitol or polyvinyl alcohols. The at least one additive may be an alkyl alcohol, an alkyl ethoxylate, or a propylene oxide derivative thereof. Exemplary alkyl alcohols, alkyl ethoxylates, or propylene oxide derivatives that can be used as at least one additive within an immersion fluid may be represented by formulas IVa through IVe. A specific example of a Formula IVd additive is 2,4,7,9-tetramethyl-4,7-decane diol. Examples of Formula IVe additives include, but are not limited to, 3,5-dimethyl-1-hexyn-3-ol and 2,6-dimethyl-4-heptanol. The at least one additive may be an alkyl acid ester such as an alkyl carboxylate. Exemplary alkyl carboxylates or alkyl acid esters that can be used as at least one additive within an immersion fluid may be represented by formulas Va through Vc. An example of a Formula Va additive includes, but is not limited to, diisopentyl tartrate. The at least one additive may be an alkyl amine having one or more amine groups including primary, secondary and tertiary amines or an alkyl amine ethoxylate. Exemplary alkyl amines or alkyl amine ethoxylates that can be used as at least one additive within an immersion fluid may be represented by formulas VIa through VIe. An example of a Formula VIa additive includes, but is not limited to, N,N'-bis(1,3-dimethylbutyl) ethylene diamine. The at least one additive may be an alkyl polyglycoside. An exemplary alkyl polyglycoside that can be used as at least one additive within an immersion fluid is represented by formula VII. The at least one additive may be a block oligomer or a polymer of ethylene and propylene oxide. Exemplary block oligomers or polymers of ethylene and propylene oxide that can be used as at least one additive within an immersion fluid may be represented by formulas VIIIa through VIIIc. The at least one additive may be a glycidyl ether or a glucamine derivative with an alkyl amine, an alkyl diamine, an alkyl alcohol, or an acetylenic alcohol. Exemplary glycidyl ether or glucamine derivatives that can be used as at least one additive within an immersion fluid may be represented by formulas IXa through IXb. An example of a Formula IXb additive includes, but is not limited to, an adduct of diethylenetriamine and n-butyl glycidyl ether. The at least one additive may be an urea, such as, for example, an alkyl urea or a dialkyl urea. The at least one additive may be a fluorinated or partially fluorinated acetylenic alcohol or diol and derivatives thereof. Exemplary fluorinated or partially fluorinated acetylenic alcohol or diol and derivatives thereof that can be used as at least one additive within an immersion fluid may be represented by formulas XIa through XIe. An example of a Formula XIa additive includes, but is not limited to, hexafluoropropanol acetylene.

The at least one additive may be a fluorosurfactant provided that the carrier medium comprises at least 1% by weight or greater of an aqueous fluid. Exemplary fluorosurfactants include: straight, branched, or cyclic hydrofluorocarbons having 2 to 10 carbon atoms wherein there are more fluorine atoms than hydrogen atoms; $F[CF(CF_2)CF_2]_n$—O—$[CH_2CH_2O]_m$—H; $F(CF_2(CF_3)CF_2O)_n CFHCF_3$ wherein n is a number ranging from 1 to 5; $F[CF(CF_3)CF_2O]_nCF_2CF_3$ wherein n is a number ranging from 1 to 5; and $HCF_2(OCF_2)_n(OCF_2CF_2)_m$—O—$CF_2H$ wherein (n+m) is a number ranging from 1 to 8; a mixture of the ammonium salts of perfluorocarboxylic acids; fluoroaliphatic esters, $[F(CF_2CF_2)_{1-7}CH_2CH_2O]_xP(O)(ONH_4)_y$ where x=1 or 2; y=2 or 1; and x+y=3 in various weight solution of isopropanol in water ranging from 25-70%; $[F(CF_2CF_2)_{1-7}CH_2CH_2O]_xP(O)(OH)_y$ where x=1 or 2; y=2 or 1; and x+y=3; $F(CF_2CF_2)_3$-$8CH_2CH_2SO_3H$ in a 4.5% by weight solution of acetic acid in water; ammonium salt of perfluoro-octanoic acid.

In certain embodiments, the at least one additive may be a salt. Exemplary salts include: metal salts, ammonium salts, sulfonium salts, phosphonium salts, halide salts, sulfate salts, sulfide salts, sulfonate salts, sulfite salts, phosphate salts, phosphonate salts, phosphite salts, and derivatives thereof. Examples of metal salts include alkali earth metal salts, such as barium chloride, calcium fluorophosphates dehydrate, calcium fluoride (n=1.4338), magnesium chloride, and magnesium sulfate; alkali metal salts such as lithium chloride, potassium chloride, sodium chloride (n=1.5443), sodium bisulfite, cesium bisulfate, cesium hydrogen phosphate, cesium methane sulfonate, cesium perchlorate, and cesium phosphate; and transition metal salts such as cadmium chloride. In certain embodiments, the salt may be a phosphonium salt such as, for example, tetrabutylphosphonium chloride, tetrabutylphosphonium methane sulfonate, tetrabutylphosphonium phosphate, tetrabutylphosphonium bromide, tetraoctylphosphonium bromide, trihexyl(tetradecyl)-phosphonium hexafluorophosphate, trihexyl(tetradecyl)-phosphonium hexafluorophosphate, and trihexyl(tetradecyl)-phosphonium bis(trifluoromethylsulfonyl)imide. In certain embodiments, the salt may be a sulfonium salt such as, for example, a trialkyl sulfonium salt such as trimethylsulfonium salt. In certain embodiments, the salt may be a sulfate salt or an alkyl or alkyl ethoxylate derivative thereof such as, for example, dimethyl sulfate, dodecyl sulfate sodium salt, methyl (tributyl)-phosphonium methyl sulfate, sodium dodecyl sulfate, sodium octyl sulfate, zinc sulfate, cadmium sulfate, cesium sulfate, and lanthanum sulfate. In certain embodiments, the salt may be a sulfonate salt such as, for example, an alkyl sulfonate, an alkyl ethyoxylate sulfonate, adamantemetane sulfonate, potassium adamantane sulfonate, and sodium xylene sulfonate. In certain embodiments, the salt may be a halide salt such as, for example, aluminum chloride, aluminum bromide, aluminum fluoride, and aluminum iodide. The at least one additive may be an an ammonium salt such as alkyl ammonium salt.

In certain embodiments, the at least one additive may be an electrolyte. In certain particular embodiments, the electrolyte may exhibit a refractive index equal to or greater than that of water and a specific absorbance less than 1 $cm^{-1}$, or less than 0.5 $cm^{-1}$, at an operating wavelength ranging from 140 to 365 nm. In embodiments wherein the operating wavelength is 193 nm, the refractive index is equal to or greater than 1.44.

In certain embodiments, the immersion fluid may contain an ionic liquid. The term "ionic liquid" as used herein describes an organic salt that is liquid at, or close to room temperature. In these embodiments, the ionic liquid may be added to the immersion fluid as an additive to, for example, an aqueous fluid and/or a non-aqueous fluid. Examples of suitable ionic liquids that can be used herein include lanthanum III trifluoromethane sulfonate, tetramethyl ammonium hexafluorophosphonate, tetrabutylphosphonium, tris(pentafluoroethyl)trifluorophosphate, tetraethylammonium bis(malonato(2-)borate, and 1-ethyl-1-methylpyrrolidinium hexafluorophosphate.

Various other components may be optionally added to the immersion fluid. These components may include, but are not limited to, stabilizers, dissolving aids, colorants, wetting agents, antifoamers, buffering agents, and other additional surfactants. Generally, the amount of each of these additives would be about 0.0001 to 1 percent by weight, or about 0.0001 to 0.1 percent by weight, based upon the total weight of the immersion fluid. In embodiments where one or more additional surfactants are added to the immersion fluid, the surfactant may be any of the surfactants disclosed herein or provided in the reference McCutcheon's Emulsifiers and Detergents.

In embodiments where the immersion fluid contains at least one additive, the immersion fluid may be prepared by mixing the at least one additive with at least one carrier medium which can be an aqueous and/or non-aqueous fluid and any additional components. In certain embodiments, one or more aqueous fluids such as ultra pure or HPLC water is combined with from about 1 ppm to the maximum solubility limit, or from about 1 ppm to about 50% by weight or from about 10 ppm to about 10,000 ppm, of at least one additive to provide the immersion fluid. In an alternative embodiment, from about 1 ppm to the maximum solubility limit, or from about 1 ppm to about 50% by weight, or from about 10 ppm to about 10,000 ppm, of at least one additive is combined with one or more aqueous fluids until a homogeneous mixture is formed and is then combined with one or more non-aqueous fluids to provide the immersion fluid. In a still further embodiment, one or more non-aqueous fluids such as the fluids disclosed herein are combined with from about 1 ppm to the maximum solubility limit of at least one additive to provide the immersion fluid. In the foregoing embodiments, the combining may be done at a temperature range of from about 20 to 60° C. or from about 40 to 60° C. to affect dissolution of the ingredients contained therein and provide a homogeneous mixture. The resulting immersion fluid may optionally be filtered to remove any undissolved particles that could potentially harm the substrate.

In alternative embodiments, the immersion fluid may comprise the carrier medium, i.e., at least one aqueous fluid, at least one non-aqueous fluid, and mixtures thereof. In embodiments wherein the immersion fluid is a mixture of carrier media, the combining may be done at a temperature range of about 20 to 60° C. or from 40 to 60° C. to provide a homogeneous mixture.

The immersion fluid is preferably used to treat at least a portion of the surface of a substrate that is coated with a photoresist or resist coating. Suitable substrates include, but are not limited to, materials such as gallium arsenide ("GaAs"), silicon, tantalum, copper, ceramics, aluminum/copper alloys, polyimides, and compositions containing silicon such as crystalline silicon, polysilicon, amorphous silicon, epitaxial silicon, silicon dioxide ("$SiO_2$"), silicon nitride, doped silicon dioxide, and the like. Further exemplary substrates include silicon, aluminum, or polymeric resins. In certain embodiments, the immersion fluid contacts at least a portion of a substrate coated with a photoresist, or a resist-coated substrate and is substantially non-reactive to the resist coating. Exemplary resist coatings include, but are not limited to, novolac resin, polyvinyl phenol copolymer, or copolymers of p-hydroxystyrene and t-butyl acrylate.

The immersion fluid is applied to at least a portion of a substrate having a photoresist coating applied thereto. The photoresist-coated substrate is then exposed to radiation through an optical device to provide a pattern that is imposed upon the photoresist coating. Examples of radiation sources that may be used include ultraviolet (uv) light, electron beam, x-ray, laser, lamp, or ion beams. In certain embodiments, the radiation source emits light at wavelengths at an operating wavelength ranging from 140 nm to 365 nm such as 193 nm and 157 nm. In some embodiments, a pre-bake or soft-bake step may be conducted prior to the exposure step. This pre-bake or soft bake step may be conducted, for example, at a temperature ranging from 90° C. to 150° C. for a time or from 30 to 120 seconds on a hot plate.

Depending upon whether the photoresist coating is positive or negative, the radiation either increases or decreased its solubility in a subsequently applied alkaline developer solution such as a process solution containing tetramethylammonium hydroxide (TMAH), potassium hydroxide, sodium hydroxide, or other base. Further examples of developer solutions include those provided in U.S. Pat. Nos. 6,455,234; 6,268,115; 6,238,849; 6,127,101; and 6,120,978. In a positive photoresist coating, the areas masked from radiation remain after development while the exposed areas are dissolved away. In a negative photoresist coating, the opposite occurs. The immersion fluid of the present invention may be suitable to treat substrates having either positive or negative photoresist coatings. The patterned photoresist image may be developed by a variety of different means, including by not limited to quiescence, immersion, spray, or puddle development. After the patterned photoresist image is developed, the substrate is baked to harden the polymer contained within the photoresist. The bake step may be conducted, for example, at a temperature ranging from 70° C. to 150° C. for a time duration of from 30 to 120 seconds.

A typical immersion lithography process uses an apparatus that has a servo motor driven wafer stage that supports and positions a resist-coated substrate or wafer underneath an optic device such as a lens. The optic device may also be a prism, a mirror or combinations thereof. The immersion fluid is dispensed onto at least a portion of resist-coated substrate through one or more nozzles to form a puddle. A radiation source that emits light at the operating wavelength then passes through lens and the puddle of immersion fluid prior to exposure to at least a portion of the resist-coated substrate.

The immersion fluid is preferably applied to the photoresist-coated substrate as a prepared solution. In alternative embodiments, however, the immersion fluid can be prepared within the application stream just prior to or during contact with the substrate surface. For example, a certain quantity of one or more additives can be injected into a continuous stream of aqueous fluid and/or non-aqueous fluid medium or immersion fluid that optionally includes additives thereby forming the immersion fluid. In some embodiments of the present invention, a portion of the at least one additive may be added to the substrate after application of the immersion fluid. In still other embodiments of the present invention, the at least one additive can be also deposited upon or comprise the material of a high surface area device such as a cartridge or filter (which may or may not include other components). A stream of aqueous fluid and/or non-aqueous fluid then passes through the cartridge or filter thereby forming the immersion fluid. In still another embodiment of the present invention, the immersion fluid is prepared during the contacting step. In this connection, at least one additive is introduced via a dropper or other means to the surface of the substrate. Aqueous fluid and/or non-aqueous fluid medium is then introduced to the surface of the substrate and mixes with the at least one additive on the surface of the substrate thereby forming the immersion fluid.

In an alternative embodiment of the invention, a concentrated composition comprising at least one additive is provided that may be diluted in an aqueous fluid and/or non-aqueous fluid medium to provide the immersion fluid. A concentrated composition of the invention, or "concentrate" allows one to dilute the concentrate to the desired strength and pH. A concentrate also permits longer shelf life and easier shipping and storage of the product.

A variety of means can be employed in contacting the immersion fluid with the substrate surface. The actual conditions of the contacting step (i.e., temperature, time, and the like) may vary over wide ranges and are generally dependent on a variety of factors such as, but not limited to, the nature and amount of residue on the surface of the substrate and the hydrophobicity or hydrophilicity of the substrate surface, etc. The contact step can be conducted in either a dynamic method such as, for example, a streamline process for applying the immersion fluid over the surface of the substrate or in a static method such as, for example, a puddle application. The immersion fluid may also be sprayed onto the surface of the substrate in a dynamic method such as in a continuous process or sprayed onto the surface and allowed to remain there in a static method. The duration of the contacting step, or time of contact of the immersion fluid to the substrate surface, can vary from a fraction of a second to hundreds of seconds. Preferably, the duration can range from 1 to 200 seconds, or from 1 to 150 seconds, or from 1 to 40 seconds. The temperature range for the contacting step can vary from 10 to 100° C., or from 10 to 40° C.

EXAMPLES

Example 1

Dynamic Surface Tension

The dynamic surface tension (DST) data was collected via the maximum bubble pressure method described in Langmuir 1986, 2, pp. 428-432. The data was collected at bubble rates that range from 0.1 bubbles/second (b/s) to 20 b/s using the Kruss BP2 bubble pressure tensiometer manufactured by Kruss, Inc. of Charlotte, N.C.

The dynamic surface tension data provides information about the performance of the at least one additive at conditions from near-equilibrium (0.1 b/s) to relatively high surface creation rates (20 b/s). High bubble rates may correspond to a dynamic liquid injection process in an immersion lithography process. It is desirable that the dynamic surface tension by reduced below that of ultrapure water at high bubble rates (i.e., 70-72 dyne/cm at 20 b/s) to provide, inter alia, better wetting of the photoresist-coated substrate. Table I provides the DST of immersion fluids containing varying concentrations of the alkyl diol additive 2,4,7,9-tetramethyl-4,7-decane diol added to a 100 mL quantity of the aqueous fluid ultra pure water. The alkyl diol additive is added to the ultra pure water at ambient temperature while stirring to provide a homogeneous solution. The immersion fluids exhibited dynamic surface tensions at high bubble rates below that of water or 72 dyne/cm. This indicates that the immersion fluid of the present invention may be effective at reducing the surface tension of water in a dynamic process.

TABLE I

Dynamic Surface Tension

| Additives Conc. | DST (dyne/cm) 0.1 b/s | DST (dyne/cm) 1 b/s | DST (dyne/cm) 6 b/s | DST (dyne/cm) 15 b/s | DST (dyne/cm) 20 b/s |
|---|---|---|---|---|---|
| 0.01 wt % | 48.7 | 54.0 | 61.9 | 67.8 | 69.0 |
| 0.03 wt % | 41.8 | 43.7 | 47.5 | 53.6 | 56.5 |
| 0.05 wt % | 38.5 | 39.6 | 41.8 | 45.6 | 47.6 |

Example 2

Wetting Property

The wetting properties of immersion fluids containing an alkyl diol additive, 2,4,7,9-tetramethyl-4,7-decane diol, and ultra pure water as a comparison, was measured on the G10/DSA10 Kruss drop shape analyzer provided by Kruss USA of Charlotte, N.C. using the Sessile drop method. In this method, the wetting properties of a localized region on the surface of a photoresist-coated substrate are estimated by measuring the contact angle between the baseline of a droplet of aqueous developer solution and the tangent at the droplet base. A high-speed camera captured the spreading of the droplet at a speed of 2 frames per second for 2 minutes and the contact angle was measured. The photoresist is a typical acrylate type 193 nm resist.

In general, lower contact angles indicate better wetting properties on resist surface. As Table II illustrates, the addition of additive improved the wetting on the resist surface.

TABLE II

Comparison of Contact Angles of UPW vs. Immersion Fluid

| Fluid | Contact Angle (0 sec) | Contact Angle (5 sec) | Contact Angle (10 sec) | Contact Angle (30 sec) |
|---|---|---|---|---|
| Ultra pure water | 62.9 | 62.9 | 62.5 | 61.6 |
| 0.02 wt % additive | 54.1 | 53.5 | 52.8 | 51.8 |

Example 2a Through 2e and Comparative Example (HPLC Water)

A quantity of 0.01% by weight or 100 ppm of the following additives: hydrophobically modified acetylenic diol or oxirane [(2-Ethyl Hexyl) Oxy]Methyl]-, Rx prod w/polyethylene glycol ether with 2,4,7,9-tetramethyl-5-decyne-4,7-diol (2:1); 2,4,7,9-tetramethyl-4,7-decane diol; ethoxylated 2,4,7,9-tetramethyl-4,7-decane diol; polysiloxane-polyester copolymer or TEGOWET™ manufactured by Goldschmidt Chemical of McDonald, Pa.; and an ethoxylated nonionic fluorosurfactant or ZONYL™ FSO with the formula: $F(CF_2CF_2)1\text{-}7CH_2CH_2O(CH_2CH_2O)yH$ where $y=0$ to ca. 15 manufactured by Dupont of Wilmington, Del. were each combined with 100 mL of the aqueous fluid HPLC water manufactured by Aldrich Chemical to provide immersion fluids 2a through 2e, respectively. The additives were added to the aqueous fluid, HPLC water, at ambient temperature while stirring to provide a homogeneous mixture. Dynamic contact angle measurements, or the contact angle measurement over a period of time, measured on unexposed 193 nm photoresist-coated substrates for each of the immersion fluids 2a through 2e and HPLC water as a comparative were obtained in accordance with the method disclosed in Example 2. The results of the dynamic contact angle measurements are provided in FIG. 1.

Example 3

Figure 2:
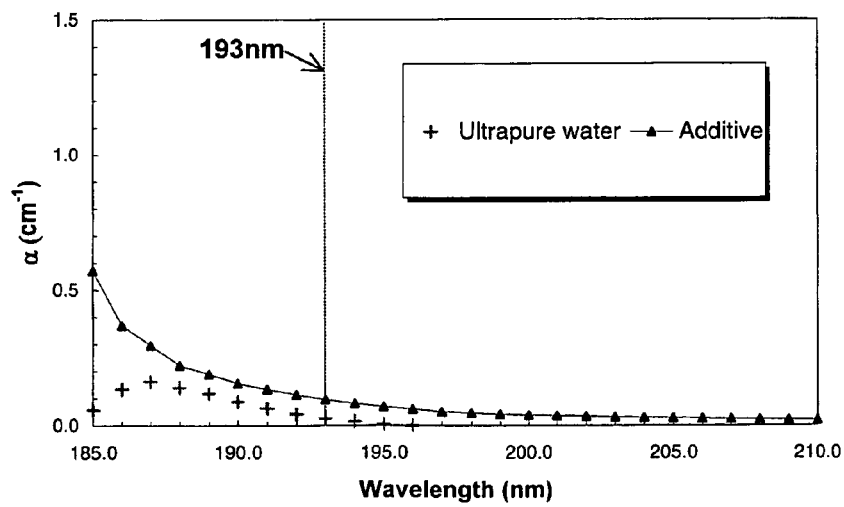
FIG. 2 provides the absorbance spectra of ultra pure water and an embodiment of the immersion fluid of the present invention that was measured using a UV spectrometer.

The absorbance of immersion fluids was measured with a UV spectrometer. The wavelength was scanned from 210 nm to 185 nm. As shown in FIG. 2, at 193 nm wavelength, the addition of 0.02 wt % of the additive 2,4,7,9-tetramethyl-4,7-decane diol only increased the absorbance slightly. The additive is enough to lower the contact angle on resist by 15% while only adding 0.03-0.05 $cm^{-1}$ to the absorbance. This absorbance is low enough to allow 1 mm working distance between optics and resist surface which maintaining the total transmission>95%. The improved wetting may lead to more uniform image formation across the wafer and enhance the image resolution.

Example 4

A quartz crystal microbalance (QCM) was used to study changes in film thickness of unexposed 193 nm photoresist solutions. A CH Instruments model CHI 405 was used as a driver and high-resolution frequency counter. The instrument was fitted with a flow cell. The quartz crystals were made by International Crystal Manufacturing. The electrode was gold, 1000 Å thick and 0.201" in diameter. The crystal resonance frequency was 7.995 MHz+/−10 Hz. The quartz crystals were spin-coated with a photoresist solution. The spin recipe was 1200 revolutions per minute (RPM) for 30 seconds and 3000 RPM for 10 seconds. The post apply bake (PAB) was 4 min at 125° C. The crystals were then exposed to UV light for the desired time. Each crystal was then mounted on a sensor probe and placed in the liquid flow cell. The instrument was controlled by a Dell PC using CHI software program. Frequency data was collected every 0.01 second. The flow of immersion fluid containing 0.01 weight percent of at least one additive was started 15 seconds after data acquisition started, to ensure that there were no glitches in the data acquisition process. The residence time through the flow cell was approximately 2 seconds. The experiment was stopped after 2 minutes. FIG. 3 provides a comparison of the change in film thickness in nm for immersion fluids containing 0.01% by weight or 100 ppm of the additives dimethyl-4-heptanol, hydrophobically modified acetylenic diol, and ethoxylated nonionic fluorosurfactant in 100 ml of ultrapure water and ultrapure water as a comparative.

Example 5

Various immersion fluids containing 0.01% by weight of at least one additive in 200 ml of the aqueous fluid ultrapure water were prepared at ambient temperature by mixing to form a homogeneous solution. Each immersion fluid was tested for foam dissipation using the Ross-Miles foam height test or ASTM D1173-53. The results of this test for each immersion fluid is provided in Table III.

TABLE III

| Additive | Initial Foam Height (cm) | Time to 0 foam (seconds) | Dynamic Foam Height (1) |
|---|---|---|---|
| 2,4,7,9-tetramethyl-decane-4,7-diol | 0 | 0 | 0 |
| 2-Hydroxy-succinic acid dibutyl ester | 1.5 | 0 | 0 |
| Ethoxylated 2,4,7,9-tetramethyl-5-decyn-4,7-diol | 1.3 | 30 | 0 |
| Hydrophobically modified acetylenic diol | 1.7 | >300 | 1.0 |
| Polysiloxane-polyester copolymer | 0.4 | 3 | 0 |

(1) Remaining foam after 1 minute measured in cm.

Example 6a through 6j

Various immersion fluids were prepared at ambient temperature by mixing to form a homogeneous solution. The identity of the carrier medium that comprises the immersion fluid, and the additive within the immersion fluid if present, are provided in Table IV. The optical properties, i.e., the absorption, absolute refractive index, and the change in refractive index with temperature (dn/dT), of the exemplary immersion fluids and a comparative example HPLC water were measured and the results are provided in Table IV. FIG. 4 compares the absolute refractive index of various immersion fluids disclosed herein measures at a wavelength of 193 nm. The absorption, or A/I, was measured using a double beam UV-Visible Light, Lamda 900 Spectrometer manufactured by Perkin-Elmer at a wavelength of 193 nm. The absolute refractive index was measured using an experimental unit referred to VUV Hilger-Chance Refractometer/Goniometer at a wavelength of 193 nm and temperature of 21.5° C. The change in refractive index with temperature (dn/dT) was measured by placing the fluid samples in a V-Groove fused silica cell into a goniometer, which is temperature-controlled and sealed from the atmosphere under stringent temperature control (±0.01° C.). The goniometer obtained measurements of absolute refractive index with absorption path-lengths≧500 μm at a wavelength of 193 nm or 157 nm.

The results in Table IV illustrate that the immersion fluids described herein can provide a higher refractive index and a dn/dT of zero relative to that of Comp. Ex. or water. In certain instances, immersion fluids having a relatively higher refractive index may enable Numerical Apertures (NA>1) needed for sub-45 nm nodes. Use of these fluids may also greater depth of focus to be achieved and may bridge the gap between water-based 193 nm Immersion and Extreme-UV lithography.

Figure 5:
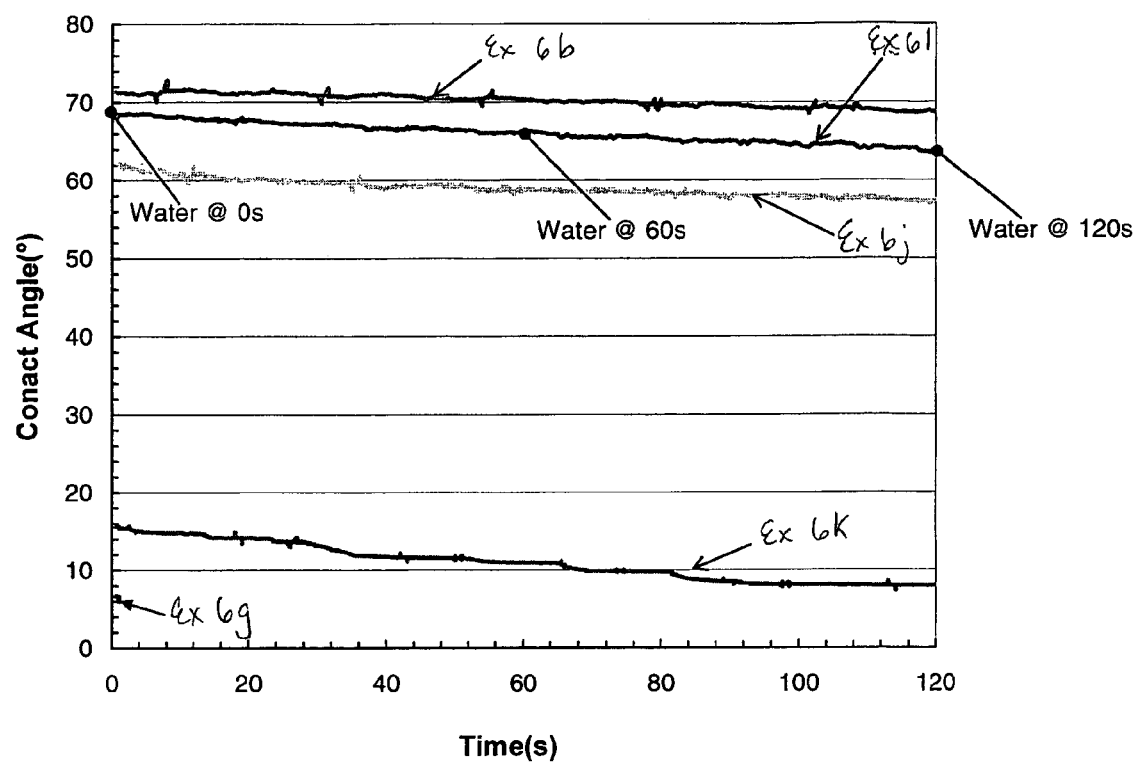
FIG. 5 provides the dynamic contact angle measurements for various embodiments of the immersion fluid of the present invention on unexposed 193 nm photoresists.

Dynamic contact angle measurements, or the contact angle measurement over a period of time, measured on unexposed 193 nm photoresist-coated substrates for immersion fluids 6b, 6g, 6j, 6k, and 6k and HPLC water as a comparative were obtained in accordance with the method disclosed in Example 2. The results of the dynamic contact angle measurements are provided in FIG. 5.

TABLE IV

| Example | Additive | Carrier Medium | Absorption (cm-1) @ 193 nm | n @ 193 nm (21.5° C.) | dn/dT (° C.) |
|---|---|---|---|---|---|
| Comp. Ex. | — | Water (HPLC) | 0.0400 | 1.4366 | −1.00E−04 |
| Ex. 6a | Zinc Sulfate (50%) | Water (HPLC) (50%) | 3.3050 | 1.4884 | −1.60E−04 |
| Ex. 6b | Cesium methane sulfonate (70%) | Water (HPLC) (30%) | 1.9390 | 1.5154 | — |
| Ex. 6c | Trimethylsulfonium methyl sulfate (40%) | Water (HPLC) (60%) | 2.6230 | 1.4885 | — |
| Ex. 6d | — | 1,3-Butanediol | 5.4860 | 1.4656 | −1.60E−04 |
| Ex. 6e | Polyvinyl alcohol (10%) | Water (HPLC) (90%) | 5.3970 | 1.4556 | 7.90E−05 |
| Ex. 6f | — | Glycerol | >6 | 1.6159 | −2.88E−04 |
| Ex. 6g | — | Dodecane | 1.1440 | 1.5573 | — |
| Ex. 6h | — | Bicyclohexyl | >6 | 1.6438 | −7.30E−04 |
| Ex. 6i | — | Cyclohexane | 1.5230 | 1.5655 | — |
| Ex. 6j | — | Methane sulfonic acid (50%)/Water (HPLC) (50%) | 0.9400 | 1.5010 | −2.50E−04 |
| Ex. 6k | — | Decalin | >6 | 1.5606 | — |
| Ex. 6l | — | Glycerol (50%)/Water (HPLC) (50%) | >6 | 1.5727 | — |

We claim:

1. A method of forming a pattern on a substrate coated with a layer of photoresist, the method comprising the steps of:
   introducing a fluid between the layer of photoresist on the substrate and a lens having an operating wavelength ranging from 140 nm to 365 nm, wherein the fluid comprises:
      at least one carrier medium comprising a mixture of an aqueous fluid and a non-aqueous fluid, wherein the at least one carrier medium has a refractive index greater than or equal to water at the same operating wavelength and wherein the non-aqueous fluid is water miscible; and
   exposing the layer of the photoresist on the substrate through the fluid to form a pattern upon the photoresist.

2. The method of claim 1 wherein the non-aqueous fluid is at least one selected from the group consisting of: methanol, ethanol, isopropyl alcohol, glycerol, ethylene glycol, polyethylene glycol, and tetrahydrofuran.

3. The method of claim 1 wherein the non-aqueous fluid is at least one selected from the group consisting of: bicyclohexyl, glycerol, and cis-2-methylcyclohexanol.

4. The method of claim 3 wherein the non-aqueous fluid is bicyclohexyl.

5. The method of claim 1 wherein the non-aqueous fluid comprises a hydrocarbon.

6. The method of claim 5 wherein the non-aqueous fluid comprises a cyclic alkane hydrocarbon.

7. The method of claim 5 wherein the non-aqueous fluid comprises an acyclic alkane hydrocarbon.

8. The method of claim 1 wherein the non-aqueous fluid comprises at least one selected from the group consisting of perfluorocyclohexane and perfluorodecalin.

9. The method of claim 1 wherein the non-aqueous fluid comprises $SF_5$.

10. The method of claim 1 wherein the non-aqueous fluid comprises a sulfur-containing compound.

11. A method of forming a pattern on a substrate coated with a layer of photoresist, the method comprising the steps of:
   introducing a fluid layer of bicyclohexyl between the layer of photoresist on the substrate and a lens having an operating wavelength ranging from 140 nm to 365 nm; and
   exposing the layer of the photoresist on the substrate through the fluid layer to form a pattern upon the photoresist.

12. A method of forming a pattern on a substrate coated with a layer of photoresist, the method comprising the steps of:
   introducing a fluid between the layer of photoresist on the substrate and a lens having an operating wavelength ranging from 140 nm to 365 nm, wherein the fluid comprises: at least one carrier medium comprising a mixture of an aqueous fluid and a non-aqueous fluid wherein the non-aqueous fluid is water miscible, wherein the at least one carrier medium has a refractive index greater than or equal to water when measured at the same operating wavelength and wherein the fluid is at least one selected from the group consisting of a gas, a liquid, a nanoparticle suspension, a supersaturated liquid, a vapor, and combinations thereof; and
   exposing the layer of the photoresist on the substrate through the fluid to form a pattern upon the photoresist.

13. A method of forming a pattern on a substrate coated with a layer of photoresist, the method comprising the steps of:

introducing a fluid between the layer of photoresist on the substrate and a lens having an operating wavelength ranging from 140 nm to 365 nm, wherein the fluid comprises:

at least one carrier medium comprising at least one non-aqueous fluid selected from the group consisting of: bicyclohexyl, glycerol, and cis-2-methylcyclohexanol wherein the at least one carrier medium has a refractive index greater than or equal to water at the same operating wavelength; and exposing the layer of the photoresist on the substrate through the fluid to form a pattern upon the photoresist.

* * * * *